US010096498B2

(12) United States Patent
Pullens et al.

(10) Patent No.: US 10,096,498 B2
(45) Date of Patent: Oct. 9, 2018

(54) ADJUSTABLE SPATIAL FILTER FOR LASER SCRIBING APPARATUS

(71) Applicant: ASM TECHNOLOGY SINGAPORE PTE LTD, Singapore (SG)

(72) Inventors: Ivo Libertus Adrianus Johannes Maria Pullens, Beuningen (NL); Wilhelmus Hubertus Smits, Beuningen (NL); Gerardus Johannes Verhaart, Beuningen (NL); Karel Maykel Richard Van Der Stam, Beuningen (NL); Guido Martinus Henricus Knippels, Beuningen (NL)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 418 days.

(21) Appl. No.: 14/513,945

(22) Filed: Oct. 14, 2014

(65) Prior Publication Data

US 2015/0104956 A1 Apr. 16, 2015

(30) Foreign Application Priority Data

Oct. 16, 2013 (EP) .................................... 13189003

(51) Int. Cl.
*B23K 26/00* (2014.01)
*B23K 26/06* (2014.01)
(Continued)

(52) U.S. Cl.
CPC .... *H01L 21/67115* (2013.01); *B23K 26/0087* (2013.01); *B23K 26/064* (2015.10);
(Continued)

(58) Field of Classification Search
CPC ........ B23K 26/0054–26/0063; B23K 26/0087; B23K 26/06–26/0619;
(Continued)

(56) References Cited

U.S. PATENT DOCUMENTS 5,319,183 A * 6/1994 Hosoya .................. B23K 1/018 134/1
5,922,224 A 7/1999 Broekroelofs
(Continued)

FOREIGN PATENT DOCUMENTS

JP 2005-244238 9/2005
WO WO 2009/102002 A1 8/2009

*Primary Examiner* — Sang Y Paik
(74) *Attorney, Agent, or Firm* — Ostrolenk Faber LLP

(57) ABSTRACT

An apparatus for radiatively scribing a planar semiconductor substrate along a scribelane that extends between opposing rows of semiconductor devices on a target surface of the substrate. The scribelane extends parallel to a first direction parallel to a second direction, these first and second directions lying respectively parallel to X and Y axes of a Cartesian coordinate system. Such an apparatus may include an illuminator for producing an array of light beams; a projection system for focusing the light beams onto the target surface; an actuator system for causing relative displacement of a substrate holder with respect to light beams parallel to an XY plane; and an adjustable spatial filter located between the illuminator and the substrate holder, and including motorized plates whose position is adjustable so as to at least partially block selectable light beams of the light beam array.

9 Claims, 6 Drawing Sheets

(51) Int. Cl.

| | |
|---|---|
| ***H01L 21/67*** | (2006.01) |
| ***B23K 26/08*** | (2014.01) |
| ***B23K 26/064*** | (2014.01) |
| ***B23K 26/364*** | (2014.01) |
| ***B23K 26/067*** | (2006.01) |
| ***B23K 26/066*** | (2014.01) |
| *H01L 21/78* | (2006.01) |

(52) U.S. Cl.
CPC ........ *B23K 26/066* (2015.10); *B23K 26/0617* (2013.01); *B23K 26/0676* (2013.01); *B23K 26/083* (2013.01); *B23K 26/364* (2015.10); *H01L 21/78* (2013.01)

(58) Field of Classification Search
CPC ......................... B23K 26/064–26/0652; B23K 26/066–26/0661; B23K 26/067–26/0676; B23K 26/083; B23K 26/364; H01L 21/67115; H01L 21/78
USPC .......................................... 219/121.6–121.86
See application file for complete search history.

(56) References Cited

U.S. PATENT DOCUMENTS

| | | | | |
|---|---|---|---|---|
| 5,979,728 | A | 11/1999 | Alfaro | |
| 6,452,132 | B1 * | 9/2002 | Fuse | B23K 26/067 219/121.7 |
| 6,605,799 | B2 * | 8/2003 | Brandinger | B23K 26/0604 219/121.74 |
| 6,635,849 | B1 * | 10/2003 | Okawa | B23K 26/043 219/121.7 |
| 7,947,920 | B2 | 5/2011 | Van Borkulo et al. | |
| 8,059,261 | B2 | 11/2011 | Verweij et al. | 355/71 |
| 2005/0109953 | A1 | 5/2005 | Otsu et al. | |
| 2008/0196229 | A1 | 8/2008 | Van Beuningen | |
| 2009/0127477 | A1 * | 5/2009 | Tanaka | B23K 26/0738 250/492.22 |
| 2009/0268177 | A1 | 10/2009 | Ebihara | 355/50 |
| 2010/0297831 | A1 * | 11/2010 | Morikazu | H01L 21/67132 438/463 |
| 2013/0217153 | A1 | 8/2013 | Knippels et al. | |

* cited by examiner

ADJUSTABLE SPATIAL FILTER FOR LASER SCRIBING APPARATUS

CROSS-REFERENCE TO RELATED APPLICATIONS

The present application claims benefit of European patent application no. 13189003.0, filed Oct. 16, 2013, the disclosure of which is incorporated herein by reference.

TECHNICAL FIELD OF THE INVENTION

The invention relates to an apparatus for radiatively scribing a substantially planar semiconductor substrate along a scribelane that extends between opposing rows of semiconductor devices on a target surface of the substrate, said scribelane having a length extending parallel to a first direction and a width extending parallel to a second direction, these first and second directions lying respectively parallel to X and Y axes of a Cartesian coordinate system, comprising:

- A substrate holder for holding the substrate;
- An illuminator for producing an adjustable array of several light beams;
- A projection system for focusing said light beams onto said target surface of the substrate when held on the substrate holder;
- An actuator system for causing relative displacement of the substrate holder with respect to said light beams parallel to an XY plane.

The invention also relates to a method of radiatively scribing a substantially planar semiconductor substrate along a scribelane that extends between opposing rows of semiconductor devices on a target surface of the substrate, comprising:

- Providing a substrate on a substrate holder;
- Providing an adjustable array of plural light beams;
- Focusing said array onto said target surface of the substrate;
- Causing relative displacement of said substrate holder relative to said array, so as to translate said array along said scribelane.

BACKGROUND OF THE INVENTION

For purposes of clarity and consistency, the following terms as used throughout this text and the appended claims should be interpreted as follows:

- The phrase “substantially planar” should be construed as referring to a substrate in the (approximate) form of a sheet, plate, leaf, wafer, platen, etc. Such a substrate will generally be (substantially) flat in form, and present two opposed major surfaces separated by a relatively thin intervening “sidewall”.
- The phrase “semiconductor substrate” should be broadly interpreted as encompassing any substrate on which a semiconductor device or other integrated device is manufactured. Such substrates may, for example, comprise silicon or germanium wafers (of various diameters), and/or wafers of compound substances such as InAs, InSb, InP, GaSb, GaP or GaAs. The term also encompasses non-semiconductor materials (such as sapphire) on which one or more layers of semiconductor material have been deposited, e.g. as in the manufacture of LEDs. The semiconductor device or other integrated device concerned may, for example, be an integrated circuit, (passive) electronic component, opto-electronic component, biological chip, MEMS device, etc. Such devices will generally be manufactured in large numbers on a given substrate, and will typically be laid out in a matrix arrangement on at least one of said major surfaces.
- The term “scribelane” (also sometimes referred to as a “dicing street”) should be interpreted as referring to a path (tract) extending along a major surface of a substrate, along which path the substrate is to be scribed. In the case of a semiconductor substrate, a scribelane will generally extend between neighboring/adjacent/opposed rows of integrated devices on the substrate, and it represents a street along which the substrate is to be “diced” so as to allow (ultimate) separation of the devices in question. Such a procedure is often referred to as “singulation”. It should be noted that scribelanes on the target surface may be arranged in regular and/or non-regular (repetitive) configurations. For example, some wafers may comprise a regular matrix of identical integrated devices separated from one another by scribelanes forming a regular orthogonal network. On the other hand, other wafers may comprise devices of different sizes, and/or located at non-regular pitches with respect to one another, implying a correspondingly irregular configuration of scribelanes. The arrangement of such scribelanes does not necessarily have to be orthogonal, e.g. it might be trigonal or hexagonal in nature.
- The phrase “radiatively scribing” refers to a procedure whereby one or more focused light beams are used in scanning motion to effect a permanent physical change in the material occurring along a scribelane, e.g. by ablating it, cracking it or shocking it, for instance. Such a procedure may be used to sever/singulate the substrate through its full thickness. Alternatively, it may be used to create a so-called “groove” (gouge, furrow, channel), which is a form of scribe that does not penetrate through the full thickness of the substrate in which it is created, i.e. creation of the groove does not directly cause severance of the substrate (in the Z direction). Substrate singulation involving such grooving is thus necessarily a multi-step approach, whereby one or more follow-up procedures are used to finish off the severing process, such as additional radiative scribing, mechanical sawing/cutting, etc. along the previously created groove.
- The term “light” should be broadly construed as referring to electromagnetic radiation at visible, infrared and/or ultraviolet wavelengths.
- The phrase “projection system” should be interpreted as referring to an optical system that is capable of focusing an incoming light beam to a given point. Such a system will generally comprise one or more lenses and/or mirrors.

These points will be discussed in more detail below.

Radiative scribing (also known as laser scribing) using an array of several light beams is a well-known technique in the art of wafer singulation. In early techniques of this type, the employed array of light beams comprised a linear group of beams that was oriented along the X direction, parallel to the scribing motion: such a set-up is described, for example, in U.S. Pat. Nos. 5,922,224 and 7,947,920, and United States Patent Application US 2013/0217153 A1. Later techniques employed a linear group of beams oriented along the Y direction, perpendicular to the scribing motion, as described, for example, in US 2005/0109953 A1. Recently, a hybrid approach employing a two-dimensional array of light beams (distributed parallel to both X and Y) has also been developed, as set forth in co-pending, non-published European patent application EP 13167717, which has a common inventor/assignee with the current application. All of the patent references cited in this paragraph are incorporated herein by reference.

In all of the above techniques, the employed illuminator must have some means of generating plural light beams. One way to provide such beams is to use a plurality of lasers, e.g. as set forth in the above-mentioned document US 2005/0109953 A1; however, in general, such an approach is currently considered to be relatively unattractive, inter alia because of the relatively large unit price for suitable lasers (such as Nd:YAG or doped fiber lasers). Another approach is to split the output from a single laser and convert it into plural beams, using some sort of beam splitter arrangement, e.g. as set forth in WO 2009/102002 A1; however, such an approach can become unattractively complicated when the produced beam array is required to comprise more than two beams, and/or as regards adjustability of the spatial configuration of beams in the array. Yet another approach uses a Diffractive Optical Element (DOE) to diffractively split an input beam into a plurality of output beams, in a given spatial arrangement. Such a method is used, for example, in the above-mentioned U.S. Pat. Nos. 5,922,224, 7,947,920, US 2013/0217153 A1 and EP 13167717. DOEs can be tailor-made to produce a desired beam array, can be stacked in series if desired so as to produce hybrid arrays, and can easily be mounted in an exchanging mechanism (such as a carrousel) to allow the beam configuration to be varied/adjusted. In addition to the above-mentioned (and possible alternative) means for producing multiple beams, an illuminator may also comprise further components, such as imaging/focusing elements, filters, etc., for performing specific processing operations on said beams.

An illuminator as set forth above may disadvantageously produce a number of unwanted "parasitic" light beams in addition to the desired array of "main" light beams. Such parasitic beams can be produced by different mechanisms. For example, when beam sub-division is performed using a DOE, higher diffraction orders than the orders in the main beam array can produce (relatively weak) satellite beams outside the perimeter of the main beam array. Alternatively/additionally, multiple reflections in optical components such as beam splitters, plan-parallel plates, etc. can produce unwanted ancillary beams. Such parasitic beams can substantially disrupt/erode the accuracy of a radiative scribing procedure if they fall onto "device regions" of a semiconductor substrate located outside a scribelane, where the heat they produce (upon impingement on the substrate) may damage delicate devices, e.g. by causing effects such as burning, melting, cracking, discoloration, delamination or a change in other physical/chemical properties (such as dielectric constant, impedance, crystalline phase, etc.). These effects are generally exacerbated in situations where the employed beam array is adjustable, since variable main beam configurations (involving adjustable numbers/spacings of main beams, shape of array, etc.) can produce relatively elaborate/unpredictable distributions of parasitic light beams.

Another issue of note involves illuminators in which multiple beams are generated by beam sub-division, which—as set forth above—can involve a relatively complex mechanism of nested beam splitters or exchangeable DOEs. A situation may arise in which a user of a radiative scribing apparatus has carefully adjusted the illuminator to produce a beam array of a first shape/geometry (e.g. using a specific DOE, or a given beam splitter configuration) for the purposes of scribing a relatively large first batch of substrates, but would also like to scribe a relatively small or urgent second batch of different substrates using a different array shape/geometry. In current apparatus, regardless of the size or importance of a batch, the same (painstaking) mechanism of beam array adjustment must be used—which can cause additional expense (e.g. if a DOE has to be tailor made) and/or can take additional time/effort (e.g. to adjust beam sub-dividing components, or in awaiting manufacture/delivery of a specified DOE).

SUMMARY OF THE INVENTION

It is an object of the invention to address these issues. More specifically, it is an object of the invention to provide a radiative scribing apparatus/method as set forth in the opening paragraphs, in which it is possible to control/eliminate the presence/influence of parasitic light beams. In addition, it is an object of the invention that such an apparatus/method should provide a supplementary mechanism for adjusting the shape/geometry/configuration of the employed array of plural light beams, outside of the employed illuminator.

These and other objects are achieved in an apparatus as specified in the opening paragraph, characterized in that it further comprises an adjustable spatial filter located between said illuminator and said substrate holder, comprising a plurality of motorized plates whose position can be adjusted so as to at least partially block selectable light beams of said array. In terms of the method set forth in the second opening paragraph above, the invention is characterized by at least partially blocking selected light beams of said array before they impinge on said substrate, using an adjustable spatial filter comprising a plurality of motorized plates.

The invention achieves inter alia the following advantages:

(i) The motorized plates of the inventive spatial filter can be moved/slid into a configuration in which they block/eclipse parasitic light beams outside a perimeter defined by the main beams in the array. If the configuration of the array is altered by adjusting the illuminator (e.g. exchanging a DOE, stacking an additional DOE in the light path, adjusting beam splitters, etc.), then the configuration of the moving/sliding plates can be adjusted accordingly, so as to (continue to) perform this blocking/eclipsing function for the new array configuration. In this way, the adjustability of the beam array produced by the illuminator can be fully exploited/matched using the adjustable spatial filter of the present invention. As will be described in more detail below, one can even automate this procedure, so that the spatial filter automatically re-adjusts itself in response to adjustment of the illuminator.

(ii) The inventive spatial filter also provides a mechanism whereby, if desired, one or more main beams in a given beam array (as produced by a given configuration of/in the illuminator) can be (temporarily) blocked/eclipsed (either wholly or partially) so as to alter the shape/geometry/configuration of the main array. Such an approach has the disadvantage of "throwing away" intensity (of the eclipsed main beams) rather than re-distributing it (which is what a DOE does, for example), but it has the advantage of providing a quick and simple mechanism by which one can "trim" or "play with" a given main beam configuration. This can, for example, be of merit in the following situations.

One may wish to adjust the employed array in a relatively simple and cheap manner, in order to scribe a small batch of substrates requiring a particular beam array configuration (e.g. as dictated by the width of the scribelanes on the substrates). Such a batch may be so small as not to merit the cost/effort of designing a new DOE. In this case, the drawback of throwing away intensity (and, thus, throughput) is outweighed by considerations of cost and convenience.

One may wish to adjust the employed array in a relatively fast manner, in order to scribe an urgent batch of substrates requiring a particular beam array configuration. Such a batch may be so urgent as not to merit the time involved in designing/acquiring a new DOE. In this case, the drawback of throwing away intensity/throughput is outweighed by considerations of speed.

Before one goes to the trouble/expense of ordering a DOE to produce a given beam configuration, one may wish to "tune" and test the configuration in question by performing a trial scribing operation on a test substrate. In this case, the inventive spatial filter offers the possibility of manipulating a default beam array so as to produce possibly interesting variants/refinements that can be tested. One or more of such variants/refinements can then be used as the basis to design/order a particular DOE.

It should be explicitly noted in these examples that, apart from totally eclipsing unwanted beams in an array, the inventive spatial filter can also be used to partially eclipse certain beams, so as to deliberately attenuate their intensity to a level somewhere between maximum and zero. As set forth in the prior art cited above (and briefly described below), it can be advantageous to have a number of weaker beams in an array, e.g. along one or more of edges of a cluster of stronger beams.

(iii) A further advantage is that the inventive spatial filter can allow relatively simple and fast correction of drift effects in (inter alia) the illuminator. The alignment of the beam array with respect to the optical axis of the projection system can vary slightly as a function of time, e.g. due to thermal effects, vibrations, etc. As a result, a parasitic beam that originally fell just inside a relatively non-critical location (such as a delimiting edge of a scribelane) may drift slightly into a more critical location (such as a device area just outside said delimiting edge). The motorized plates of the inventive spatial filter allow such a drifting parasitic beam to be intercepted/blocked before it can cause damage.

These aspects of the invention result in a highly flexible scribing apparatus/process that produces a superior quality and more flexible result in a variety of respects, as will be elucidated in more detail below.

As general notes regarding the motorized plates employed in the current invention, it should be noted that:

The term "motorized" should be broadly interpreted as referring to locomotion effected by any form of motor, actuator, pneumatic drive, hydraulic drive, magnetic drive, etc., that can be turned on/off and/or controlled by a remote signal (such as an electrical signal, for instance). This is in contrast to manual/hand-operated plates, for example.

There are various ways in which the plates in question can be moved into/out of a desired position. For example, they can be slid or swung within a plane coincident with their own plane. Alternatively, they can, for instance, be canted toward/away from the optical axis (Z direction/median path of beam array), somewhat reminiscent of two halves of a lifting bridge. The skilled artisan will be able to choose a manner of movement that is suited to the particulars (e.g. available space) of a given situation The plates may be made of any material that can be used to eclipse a light beam of the wavelength produced by the illuminator. For example, they may comprise metal, metallized glass, ceramic, plastic, etc. If desired, they may be cooled, so as to mitigate heating effects caused by absorption of energy from eclipsed beams. Alternatively, their backside (facing away from the substrate) may be embodied to reflect an intercepted (portion of a) beam into a beam dump, for example.

The shape of the plates is a matter of choice, and may, if desired, be tailored to the cross-sectional form of a given, commonly employed beam array. In a useful embodiment, the plates are essentially rectangular in shape. Of particular importance is the "eclipsing edge" of each plate, which is moved in and out of the path of the light beams being (partially) eclipsed; this edge can, for example, be substantially straight, curved, angled, castellated, etc., according to choice. The thickness of the plate (parallel to the optical axis) is also a matter of choice, though, in general, it should be large enough to ensure satisfactory rigidity of the plates. If desired, this thickness can be tapered/narrowed toward the eclipsing edge of each plate, producing a blade-like form.

In general terms, the spatial filter according to the current invention could, in principle, be used to block any given beam(s) in the beam array emerging from the illuminator—regardless of whether the beam(s) in question have a peripheral or a central/core location. However, in practice, the inventors have found the present invention to be of particular use in suppressing unwanted beams at/near the periphery of the array. In this respect, a particular embodiment of the current invention is characterized in that:

The illuminator is embodied to produce an array in which there is at least one of:

A first plurality of light beams with mutually different X coordinates;

A second plurality of light beams with mutually different Y coordinates;

The motorized plates in the adjustable spatial filter are oriented so as to be able to at least partially block at least one of:

A first peripheral subset of said first plurality of light beams;

A second peripheral subset of said second plurality of light beams, located outside a chosen inner region of the array.

This embodiment can be elucidated in more detail as follows:

(a) The prior art cited above sets forth the advantages of using sets of plural light beams that are arranged along X, or along Y, or are distributed in both X and Y. For example:

Using multiple beams in the Y direction can allow a scribelane to be grooved in a single pass rather than in multiple passes, thus giving a throughput advantage.

Distributing radiative flux among several beams in the Y direction can result in a sum-flux with a sharper fall-off along its flanks, thus reducing the size of the so-called Heat Affected Zone (HAZ)—which is essentially a "leakage zone" of heat out of the scribelane and into the device areas bordering it.

Distributing radiative flux among plural beams in the Y or X direction can allow a non-flat intensity profile to be created. For example, beams near the center of the array may be chosen to be more intense than beams near the edges of the array. This can allow certain "thermal processing effects" (e.g. non-ablative pre- or post-heating) to be achieved at the extremities of the beam array.

Using multiple beams in the X direction can allow relatively deep scribing ablation to occur in a single (tiered) pass rather than in multiple passes, thus giving a throughput advantage. Appropriate adjustment of the separation of successive beams in the X direction can be used to determine whether, after an initial beam passes a given point, a subsequent beam to pass the same point will see molten or solidified substrate material.

Distributing radiative flux along multiple light beams in the X direction allows different beams to be focused to different sub-surface levels in the substrate material, thus allowing so-called "stealth dicing" to be performed at relatively high throughput, etc.

(b) If one first considers the Y direction—which is the direction parallel to the width of the scribelane—this is of particular importance in that it defines a sharp transition (at the scribelane edge) between relatively non-critical wafer real estate (the scribelane) and much more critical wafer real estate (the integrated devices bordering the scribelane). Consequently, controlling the Y coordinate of a light beam near the edge of the scribelane can be of particular importance in preventing collateral damage to devices running alongside the scribelane. Even if such a light beam remains within the scribelane, it can still damage devices if it is too near the edge of the scribelane, by influencing the HAZ. For this reason, it is important to be able to curtail the effect of beams located along the extremities of the beam in the Y direction (at/near the edges of the scribelane). Put another way, if one defines a chosen "inner region" (core) of the array, then it is important to be able to accurately delimit the edges of this inner region in the ±Y direction.

(c) Turning now to the X direction, one can identify the following potential issues:

A (sufficiently intense) parasitic beam that runs ahead of the leading edge of the array or lags behind its trailing edge (as viewed in the scribing (X) direction) can cause unwanted delamination effects ahead of or behind the array, respectively. This can be a particular problem along/near the edges of the scribelane (proximal the device areas).

In general, not all scribelanes on a substrate will be mutually parallel; for example, the scribelanes may be arranged according to an orthogonal matrix—in which case the length direction (X) for one orientation of scribelane will correspond to the width direction (Y) for another orientation of scribelane. In such cases, it will generally be desirable to have some means of changing the orientation of the beam array (in an XY plane) relative to the substrate surface.

One way to do this is to rotate the substrate (+holder) about the Z axis.

Alternatively, one can rotate the beam array about the Z axis—a relatively easy matter if the array is generated using a DOE, for example. If the inventive spatial filter is not co-rotated, then it is useful to have (sets of) motorized plates that can be used to influence beams in both X and Y directions—so that the beam array can be delimited in a desired direction regardless of its rotational stance about Z.

Just as side streets in a city can terminate onto a main street, so too can a first scribelane terminate (e.g. perpendicularly) onto a second scribelane. In such a case, the X direction for the first scribelane will have a component in the width (Y) direction of the second scribelane. Consequently, it is important that, when scribing the first scribelane, the distribution of beams along the X direction be accurately defined/curtailed along the leading edge of the array, so as to prevent unwanted incursion beyond the edge of the second scribelane (and into a device area) when the beam array emerges from the first scribelane and terminates in the second scribelane. The same argument applies to the trailing edge of the beam array, since this will become the leading edge when the scribing direction is reversed.

Summarizing, if one defines a chosen "inner region" (core) of the array, then it is important to be able to accurately delimit the edges of this inner region in the ±X direction.

With particular reference to the matter just discussed, two particular embodiments of the present invention can be set forth as follows:

In one embodiment, the adjustable spatial filter comprises at least two motorized plates that are independently movable parallel to the X direction and that are disposed on opposite sides of the array. Such a set-up is particularly useful in defining the X-extent of the array and the X-positioning of its leading and trailing edges. The opposed edges of the two motorized plates may, for example, be straight in form and run parallel to the Y direction.

Similarly, in another (related/complementary) embodiment, the adjustable spatial filter comprises at least two motorized plates that are independently movable parallel to the Y direction and that are disposed on opposite sides of the array. Such a set-up is particularly useful in defining the Y-extent of the array and the Y-positioning of its left and right edges (regarded w.r.t. the scribing direction). The opposed edges of the two motorized plates may, for example, be straight in form and run parallel to the X direction.

If both of these embodiments are employed in unison, then one obtains a set of four cooperating plates—one pair for X adjustment and the other pair for Y adjustment.

However, it should be noted that this is certainly not the only possibility admitted by the current invention. For example, if the employed beam array consistently has a hexagonal cross-section in the XY plane, then the inventive spatial filter might instead comprise three pairs of cooperating plates, movable/slidable along axes that are rotated at 60° intervals with respect to one another. Moreover, as mentioned above, the eclipsing edges of the plates need not necessarily be straight; for example, if the employed beam array consistently has an elliptical cross-section in the XY plane, then the eclipsing edges of the plates might instead have a curved form. The skilled artisan will understand these points and be able to choose the number, arrangement and shape of the motorized plates to suit the particulars of a given situation.

In certain examples given above, each of the motorized plates in the inventive spatial filter can be embodied as a one-piece/non-composite structure. However, this is certainly not the only possibility, and the current invention also provides more flexible/versatile approaches. In one such embodiment, at least one of the plates comprises a plurality of parallel fingers that are individually slidable relative to one another. Such a construction allows the plate(s) in question to have an eclipsing edge that can have a "programmable" shape, achieved by moving the component fingers into different relative configurations. The number of fingers in such a sub-divided plate is a matter of choice: it could be as low as two (giving a relatively rough "resolution" to the various shapes that could be adopted by the eclipsing edge), or substantially higher—such as 5-10 (or more)—thus allowing a much finer shape resolution to be achieved. There are many suitable manners in which such a collection of fingers can be driven w.r.t. one another, e.g. using individual rack-and-pinion mechanisms that thrust against a mutual mounting, or individual (mini) linear motors, for instance. The relative positions of the fingers can be tracked using (mini) optical encoders, for example; alternatively, if a stepper motor is used to drive the fingers, then finger position can be set/tracked by counting steps made by the motor. The skilled artisan will be well able to tailor the number, actuation mechanism and position determining method of such fingers to the particulars of a given situation.

Needless to say, similar actuation/position measurement techniques can also be used in the case of non-subdivided plates.

As already set forth above, there are many ways in which the illuminator can produce an array of light beams. In addition to the examples already given above, one could also consider the use of fiber-optic splitters, polarizing beam splitters, Acousto-optic Modulators (to achieve a form of temporal subdivision), beam-subdividing cylindrical lens arrays/Refractive Optical Elements (ROEs), etc. Although these various examples have their own merits, the inventors have achieved particularly satisfactory results using an illuminator in which the array is produced with the aid of at least one DOE (used to sub-divide one or more input laser beams). A DOE is essentially a plate-like optical element that uses diffraction effects to split an input light beam into an array of output light beams with a specific geometric layout/intensity distribution. DOEs are commercially available "off-the-shelf", but are also commonly designed and made to certain specifications. They can be obtained (inter alia) from companies such as:

HOLOEYE Photonics AG, Berlin, Germany:
http://holoeye.com/diffractive-optics/—
LightTrans GmbH, Jena, Germany:
http://www.lighttrans.com/diffractive_optics_t.html
SÜSS MicroOptics, Hauterive, Switzerland:
http://www.suss-microoptics.com/products-solutions/diffractive-optics.html Apart from their ability to produce quite specific and "exotic" patterns, DOEs have the great advantage that they (substantially) conserve available light intensity, in that they produce a pattern by (efficient) sub-division/re-direction of flux rather than by selective occlusion/transmission. They also have the advantage of being relatively compact. A further advantage is that they tend to be easy to align, since the exact position of (lateral) impingement of an input light beam on the optical surface of the DOE is generally not of critical importance to achieving the desired output pattern; consequently, they can deal well with drift effects in the input beam, for example.

Moreover, if the input beam is collimated, then the output beam array will also be collimated, and thus the (axial) placement location of the DOE along the optical axis of the illuminator/projection system is typically a non-critical matter. However, a possible downside of DOEs is that, since they work using diffraction effects, they can produce unwanted higher diffraction orders that manifest themselves as parasitic "satellite beams" accompanying the desired output pattern of "main beams". Meritoriously, the adjustable spatial filter of the current invention can be used to intercept/curtail such satellite beams. In addition, as already set forth above, it can be used to "play with" the pattern of main beams produced by a given DOE, allowing variant patterns to be produced for test/investigation purposes.

In a refinement of the embodiment set forth in the previous paragraph, the beam array is produced using a series arrangement of at least two DOEs, one of which produces beam sub-division in the X direction and the other of which produces beam sub-division in the Y-direction (for example). Use of the expression "series arrangement" in this situation indicates that light traverses first one DOE, then the other. Such an arrangement is advantageous in that it offers more flexibility as regards separate adjustment of parameters of the beam array in the X and Y directions (for example).

The beam array produced by a DOE-based illuminator can be rendered "adjustable" by providing the possibility of switching different DOEs in and out of the input beam path. Such switching can be performed manually (e.g. by inserting/removing DOEs via a slit or a drawer mechanism such as that in a CD player, for instance). However, a generally more satisfactory arrangement is one in which the illuminator comprises:

A holder for storing a plurality of different DOEs;
An exchanging mechanism for positioning a chosen one of said DOEs upon an optical axis of said projection system.

A variety of suitable holders/exchanging mechanisms can be contemplated for this purpose. For example, one can use a carrousel principle, or a sliding rack such as that used to store/load photographic slides in a slide projector. In the case of a series arrangement of two (or more) DOEs, two (or more) exchangers could be provided in series arrangement.

Advantages of such an embodiment are inter alia that:

It allows DOEs to be stored/switched wholly within the radiative scribing apparatus, thus reducing the risk of contamination/damage attendant to external storage/handling;
It generally allows more rapid DOE exchange than in the case of removal/reloading of a DOE by hand;
It can be automated.

With particular regard to the last point set forth above, an advantageous embodiment of the radiative scribing apparatus according to the present invention comprises a controller that can automatically adjust the (position of the motorized plates in the) inventive spatial filter in dependence upon which DOE is chosen from the employed holder. Such an embodiment greatly augments ease of use of the inventive apparatus/method, and generally guarantees satisfactory accuracy and reliability. One way of performing such an embodiment might be to depict on a display device (such as an LCD (touch-)screen) a variety of scribing "recipes" (e.g. arranged according to width and depth of the associated scribe/groove), or the various types of DOEs present in the holder (e.g. on the basis of the array shape/size that they produce). When a user selects a given recipe/DOE (e.g. by touching the screen or using a mouse click), the controller consults a lookup table to determine the (previously calibrated) positions of the motorized plates best suited to the recipe/DOE in question, making allowances for the scribing direction. If desired, the user can still choose an option to "manually" select the plate positions that he would like to use, e.g. by moving ("dragging") illustrated plates on the display device into a particular position relative to an illustrated beam array, or by entering coordinates on a keyboard. There are many other variants that fall within the scope of this embodiment, and the skilled artisan will be able to choose one best suited to the needs of a given situation.

It should be noted that a prior calibration run can be used to create a correlation between the actual position of a motorized plate with respect to a reference (such as the optical axis of the illuminator/projection system, or a point in a given beam array, for example) and a readout from whatever position measuring system is associated with the plate in question (such as an optical encoder, or a counter in a stepper motor, for example). If desired, such a calibration procedure can, for example, be performed with the aid of an image registration apparatus/method such as that set forth in co-pending, non-published European patent application EP 13156641, which has a common inventor/assignee with the current application.

It should be explicitly noted that not all light beams in the beam array used in the current invention need have the same focal depth (in the Z direction) relative to the XY plane. For example, in stealth dicing, a scribing light beam is focused into the bulk of a substrate rather than onto its surface. If desired, a related approach may be used in the current invention. For example:

- When considered in the X direction, one may elect to have successive beams focused to successively greater depths (with trailing beams focused to deeper depths than leading beams).
- As regards the Y direction, one may elect to have beams located near the edges of a scribelane to be focused to a more shallow focal depth than beams located toward the center of the scribelane.

Regardless of the chosen Z position of the focal points of the beams in the array, the adjustable spatial filter according to the current invention can be used to manipulate the extent/shape/configuration of the array in a plane perpendicular to Z.

In an exemplary apparatus/method according to the present invention—which is not intended to be in any way limiting upon the scope of the invention but is merely presented here for the purpose of giving concrete, practical examples—the following aspects apply:

- An input laser beam is selected to have a wavelength in the range 200-3000 nm and an output power in the range 1 mW-100 W. The chosen laser will depend largely on the material of the substrate being scribed. Wavelengths in this range can be produced by a variety of lasers. For example, a solid-state Nd:YAG laser produces a wavelength of 1064 nm, with harmonics at 532 nm and 355 nm. Said 355 nm wavelength is particularly attractive because:
  - It tends to be strongly absorbed by semiconductor materials;
  - It can generally be focused relatively easily to a relatively small spot size. However, this is purely a matter of choice, and other wavelengths can alternatively be employed.
- Use is made of a laser source capable of delivering a pulsed laser beam, with a pulse duration in the range of about 1 microsecond-100 femtoseconds.
- Using a DOE, the input laser is divided so as to form a two-dimensional array of light beams, e.g. in the form of a rectangle comprising 3-4 beams in the X-direction and 2-4 beams in the Y direction.
- An adjustable spatial filter is located at a back focal plane of the projection system, the filter comprising two pairs of sliding plates that straddle the array and can intercept it by moving along two orthogonal directions (X and Y). The plates are made of metal, each with a thickness of the order of about 1 mm and an eclipsing edge with a length of the order of about 5 mm. Each is driven using a small linear motor, in conjunction with an optical encoder.

BRIEF DESCRIPTION OF THE DRAWINGS

The invention will now be elucidated in more detail on the basis of exemplary embodiments and the accompanying schematic drawings, in which.

DESCRIPTION OF EMBODIMENTS

In the Figures, where pertinent, corresponding parts are indicated using corresponding reference symbols. It should be explicitly noted that the Figures are generally not to scale.

Embodiment 1

Figure 1:
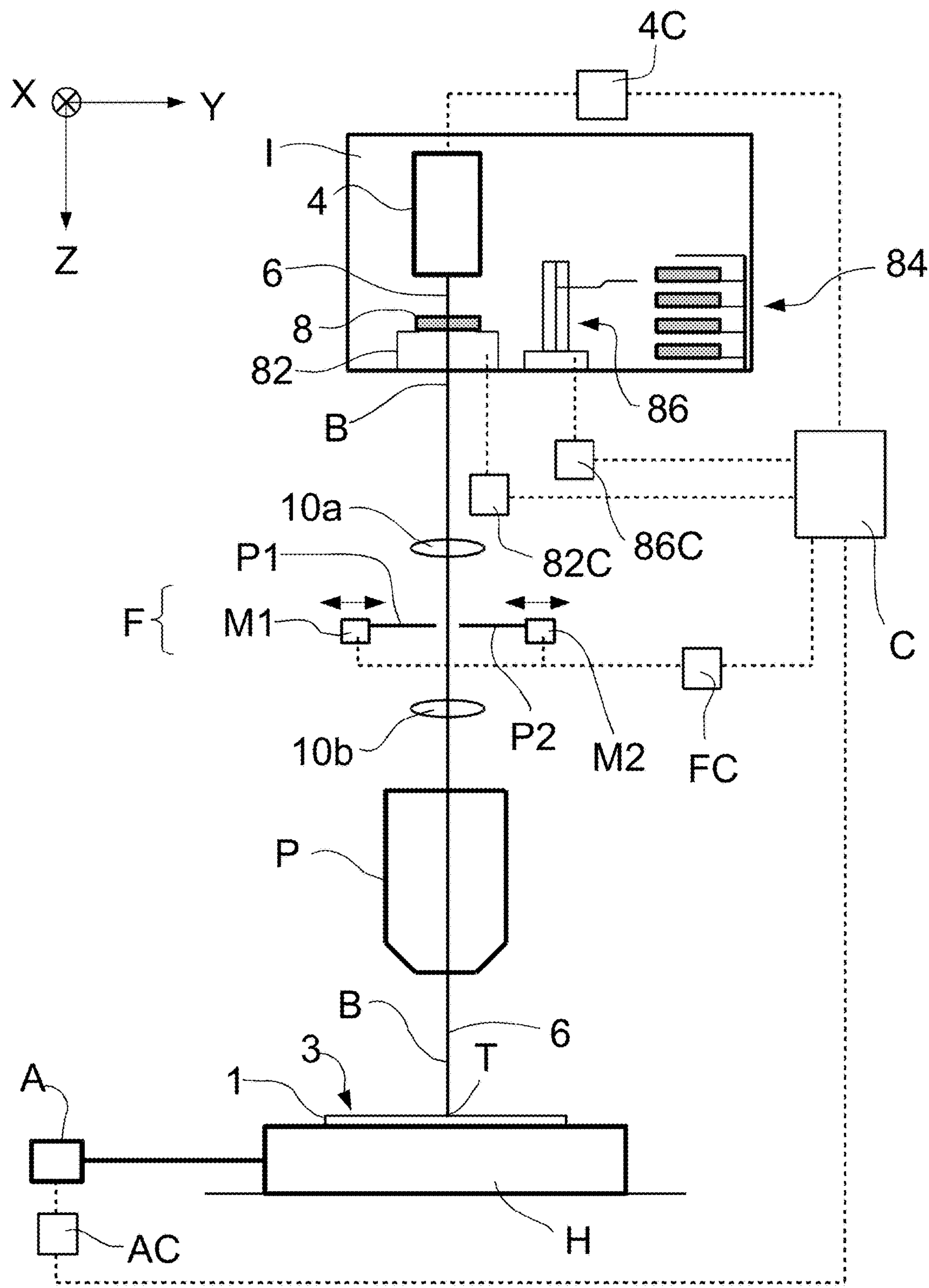
FIG. 1 renders an elevation (viewed along an X axis) of part of a particular embodiment of a radiative scribing apparatus according to the current invention.

FIG. 1 renders an elevational view of part of a particular embodiment of a radiative scribing apparatus according to the current invention, usable to radiatively scribe a substantially planar semiconductor substrate 1 along at least one scribelane 2 (not depicted; see FIGS. 2 and 3) on a target surface 3 of the substrate 1. On the other hand, FIG. 2 (in addition to FIGS. 3 and 4) renders a magnified plan view of an aspect of the lower portion of FIG. 1. Note the Cartesian coordinate system XYZ shown in the Figures.

Figure 2:
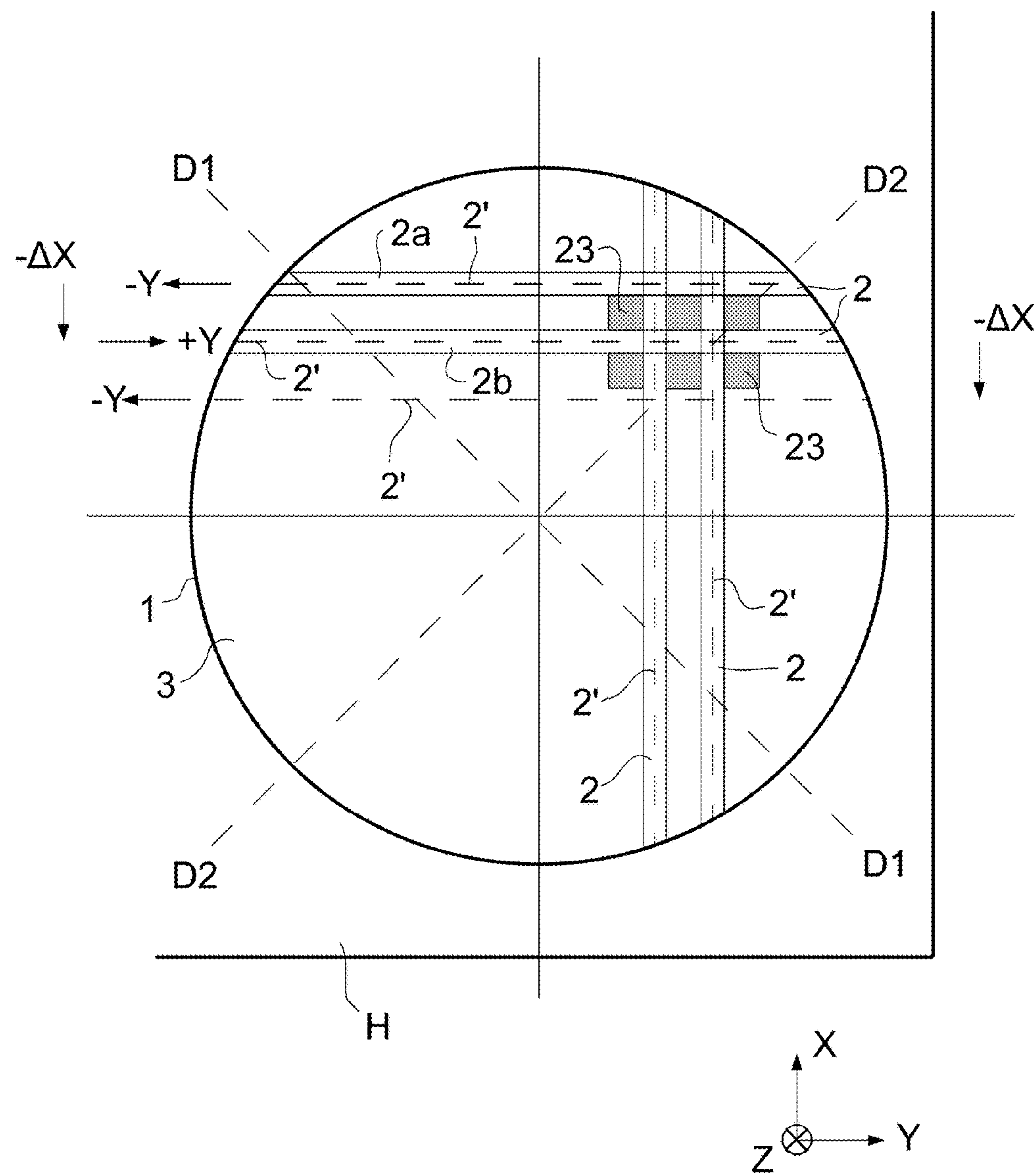
FIG. 2 renders a magnified plan view (along a Z axis) of part of the subject of FIG. 1, in particular a lower portion of FIG. 1.

Specifically, FIGS. 1 and 2 collectively show the following:

- A substrate holder (table, chuck) H for holding the substrate 1.
- An illuminator I for producing an adjustable array B of several light beams.
- A projection system P for focusing the beam array B onto the target surface 3 of the substrate 1 as held on the substrate holder H. The region of impingement of the array B upon the substrate 1 is here denoted by T.
- An actuator system (stage assembly) A for causing relative displacement of the substrate holder H with respect to the beam array B parallel to an XY plane.

In more detail, the illuminator I comprises the following components:

- A laser source 4, which outputs (pulsed) laser radiation along an optical axis 6 (common also to projection system P). The laser source 4 is connected to a controller 4C that can be used inter alia to control parameters such as the pulse duration and power/fluence of said laser radiation. Note in FIG. 1 that control lines (buses) are indicated using dashed/broken lines.

Figure 3:
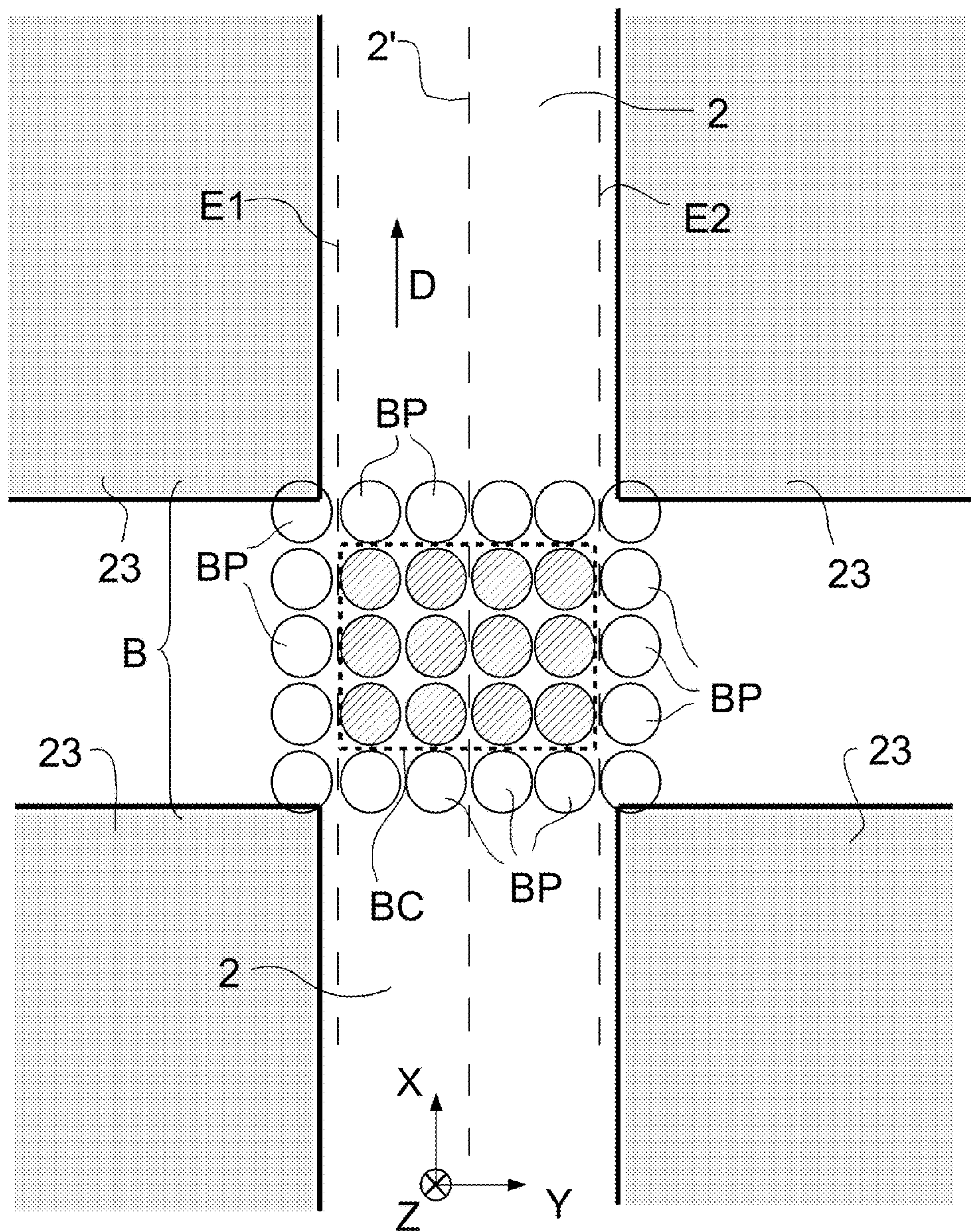
FIG. 3 depicts a further magnified plan view (along a Z axis) of a region of interest of the subject of FIG. 2.

A beam sub-divider (beam splitter) 8, which converts said laser radiation into an array B of plural laser beams (see FIG. 3, for example). In this particular case, the beam sub-divider 8 comprises a DOE 8 that is mounted on a rotatable table 82, allowing the DOE to be rotated about a Z axis. This rotational aspect of table 82 is controlled by controller 82C.

A holder 84 for storing a plurality of different DOEs. In this case, the holder 84 is embodied as a slotted rack/library.

An exchanging mechanism 86 for positioning a chosen DOE from the holder 84 onto the table 82 (and thereby onto an optical axis of the projection system P). The exchanging mechanism 86 is connected to a controller 86 C, and is depicted here as a (SCARA) robot with an articulated gripping arm that has multiple motional degrees of freedom; however, many other different exchanging mechanisms can be contemplated.

It is further noted that:

Typically, a substrate 1 that is to undergo scribing will first be mounted on a foil that is spanned within a circumferential frame (not depicted), and this composite structure of substrate 1, foil and circumferential frame is then mounted on the substrate holder H, e.g. via peripheral clamping. After singulating an entire substrate 1, it can be separated along the various scribelines 2 by laterally stretching said foil, for example. These are such intrinsic aspects of the field of semiconductor substrate scribing that they do not require further elucidation here; for more information, reference is made to the following publications (for example):

US 2008/0196229 A1 and U.S. Pat. No. 5,979,728.

http://en.wikipedia.org/wiki/Dicing_tape http://www.lintec-usa.com/di_t.cfm#anc01.

In addition to focusing (components of) the array B onto or into the substrate 1, as desired, the projection system P may also perform aberration/distortion correction, for example.

In accordance with the current invention, FIG. 1 additionally shows an adjustable spatial filter F located between the illuminator I and the substrate holder H. This spatial filter F comprises a plurality of motorized plates P1, P2, P3, P4 (see also FIG. 4), whose position can be adjusted so as to at least partially block selectable light beams of the array B. Two of these plates—P1 and P2—are movable back and forth parallel to the Y direction using respective motors M1, M2, which are connected to a controller FC. A corresponding pair of plates P3, P4 (not depicted in FIG. 1; see FIG. 4) can similarly be moved back and forth parallel to the X direction using respective motors M3, M4 (not depicted), which are also connected to controller FC. The various controllers 4C, 82C, 86C, AC, FC mentioned heretofore are connected to a master controller C.

As here depicted, the beam array B leaving the DOE 8 and entering the projection system P comprises essentially collimated beams. In this particular setup, an intermediate focal plane is created using lenses 10*a*, 10*b*, and it is within this plane (or closely adjacent to it) that the plates P1, P2, P3, P4 are disposed. In this way, the (eclipsing edges of the) plates P1-P4 are effectively focused onto the target surface 3, together with the beam B.

FIG. 2 shows the substrate 1 viewed from above, as it rests upon the substrate holder H. Upon the target surface 3, various scribelanes 2 are illustrated. These scribelanes 2 run in an X/Y grid pattern between integrated devices 23 that are distributed in a matrix arrangement on the surface 3; there will generally be very many such devices 23 on a typical semiconductor substrate 1, but only a few have been illustrated here, so as not to clutter the drawing. The Figure depicts a "longitudinal scan and lateral step" approach to scribing the substrate 1 along multiple, successive scribelanes 2 in a particular direction (in this case ±Y). For example:

The substrate 1 is scribed along scribelane 2a by scanning the beam array B in the −Y direction; in practice, this relative motion can actually be achieved by using the actuator system A (see FIG. 1) to scan the substrate holder H in the +Y direction.

After completing the scribing run along scribelane 2a, the actuator system A will be used to step the substrate holder H in the +X direction by an amount ΔX; as a result, the beam array B will effectively be stepped with respect to the target surface 3 by an amount −ΔX.

The substrate 1 is now scribed along scribelane 2*b* by scanning the beam array B in the +Y direction; in practice, this relative motion can be achieved by using the actuator system A to scan the substrate holder H in the □Y direction.

And so forth.

For reference purposes, FIG. 2 also shows longitudinal, central axes 2' of a number of scribelanes 2.

It should be noted that there are various ways of embodying the actuator system A, and the skilled artisan will be able to implement many alternatives in this regard. One particular embodiment, which is schematically depicted in FIG. 2, uses two separate linear motors (not depicted) to independently drive the substrate holder H along axes D1 and D2, which subtend angles of 45° with the X,Y axes; motion in X or Y then involves concurrent driving along the D1 and D2 axes. Typically, the substrate holder H will be caused to float smoothly over a reference surface (such as a polished stone surface) parallel to the XY plane, e.g. with the aid of an air bearing or magnetic bearing (not depicted). The exact position of the substrate holder H can be monitored and controlled with the aid of positioning instruments such as interferometers or linear encoders, for example (not depicted). Moreover, focus control/level sensing (not depicted) will also typically be employed, to ensure that the target surface 3 of the substrate 1 is maintained at a desired level with respect to the projection system P. All such conventional positioning and control aspects will be very familiar to the skilled artisan, and do not require any further elucidation here.

Turning now to FIG. 3, this shows a magnified plan view of a region of interest of the substrate 1. Depicted is a scribelane 2 (with central axis 2') extending in the X direction between four devices 23. Beam array B is shown as translating in a direction D along the course of the scribelane 2. In this particular case, the beam array B is a two-dimensional array that can be regarded as comprising the following portions:

(A) A core (central region) BC of twelve main beams, denoted by hatched circles; so as to facilitate labeling, core BC is depicted here as being schematically enclosed by a dashed (imaginary) outline. The component beams in the core BC are arranged in a four x three rectangular configuration. In a specific (non-limiting) example:

The core BC has a width (parallel to Y) in the range 40-70 μm (e.g. 45 μm), and a length (parallel to X) in the range 100-1000 μm (e.g. 150 μm).

Each of the twelve main beams in the core BC has a diameter in the range 5-15 μm (e.g. 12 μm).

The width of the scribelane 2 (parallel to Y) is 5-10 μm greater than the width of the core BC.

(B) A periphery (outer region) BP comprising multiple parasitic/satellite beams, denoted by un-hatched circles. These parasitic beams may, for example, be unwanted higher diffraction orders produced by the DOE 8, and will generally be weaker than the main beams in the core BC. In this particular case, the periphery BP is illustrated as comprising a "single fence" of parasitic beams arranged around the core BC; however, in practical situations, there may be many more such parasitic beams extending further outward from the core BC (and getting steadily weaker). The illustrated situation is a simplification aimed at avoiding excessive cluttering of the Figure.

It is immediately evident from FIG. 3 that:

Parasitic beams in the periphery BP located to the left and right of the core BC (in the ±Y direction) are positioned in locations where they will encroach upon the device areas 23 during translation of the beam array B. Even if they were not to directly intrude upon the device areas 23, the fact that they overstep the illustrated (imaginary) edge lines E1, E2 means that they can undesirably augment the HAZ of the devices 23.

Moreover, the periphery BP also comprises parasitic beams that are located fore and aft of the core BC (in the ±X direction), and these can cause unwanted lamination effects in the scribelane 2.

These effects create a generally undesirable situation, which can lead to a very unacceptable scribing result.

Figure 4:
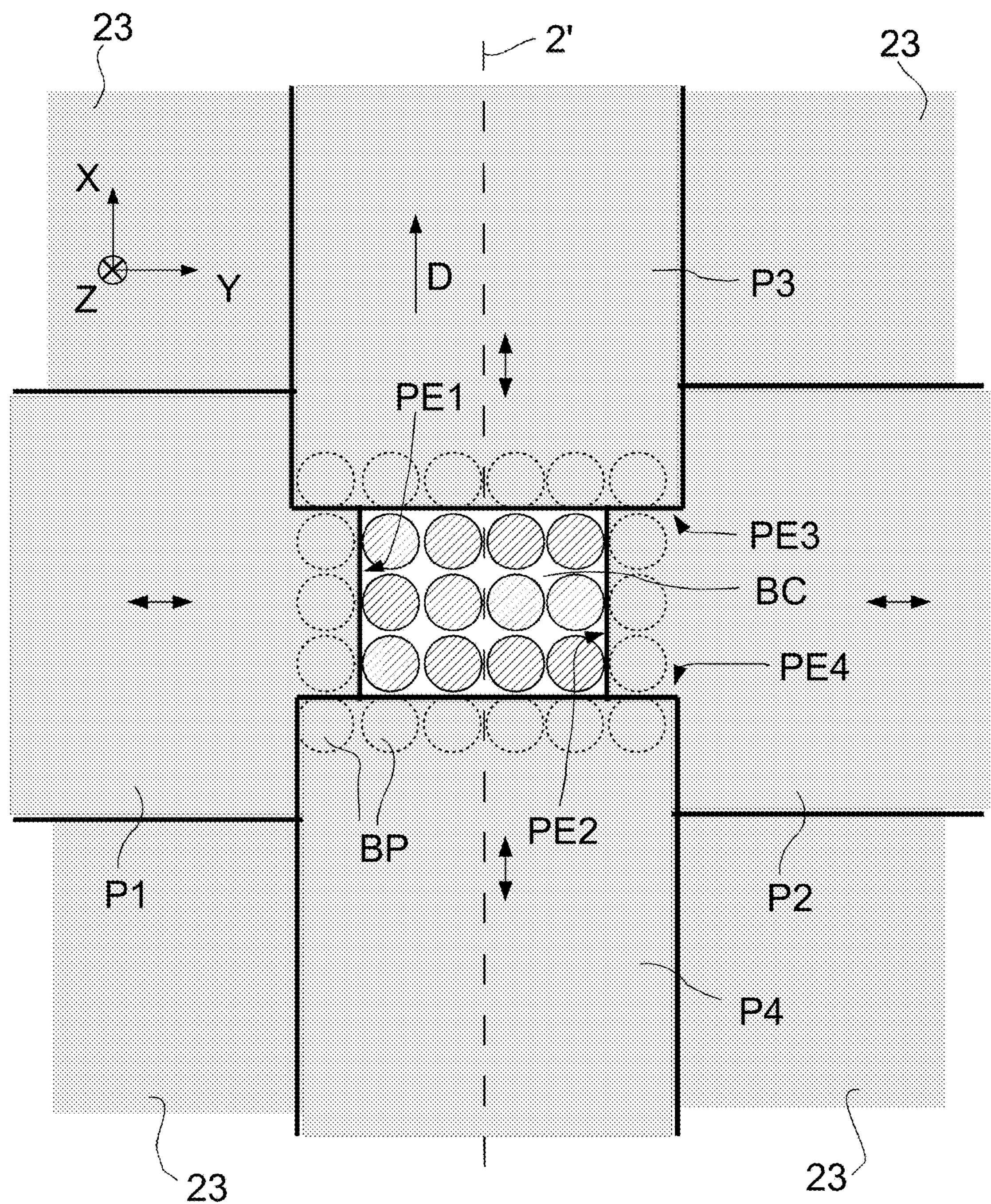
FIG. 4 shows the subject of FIG. 3 during enaction of a particular embodiment of a method according to the current invention.

To address this problem, FIG. 4 schematically illustrates how the motorized plates P1, P2, P3, P4 referred to above can be used to eclipse the periphery BP and only allow the core BC to pass through to the scribelane 2. Here, it should be explicitly noted that FIG. 4 shows the effects/images of the plates P1-P4 at the level of the target surface 3 of the substrate 1—the actual plates P1-P4 being physically located in the abovementioned intermediate focal plane between lenses 10*a* and 10*b*. To this end, motors M1, M2 (not depicted in FIG. 4) have been used to move the respective eclipsing edges PE1, PE2 of plates P1, P2 in the Y direction, so as to park said eclipsing edges PE1, PE2 on the respective left and right boundaries between the core BC and periphery BP. Similarly, motors M3, M4 (not depicted) have been used to move the respective eclipsing edges PE3, PE4 of plates P3, P4 in the X direction, so as to park said eclipsing edges PE3, PE4 on the respective fore and aft boundaries between the core BC and periphery BP.

The plates P1-P4 are, for example, made of sheet stainless steel with a thickness (parallel to Z) of ca. 1 mm and a width (perpendicular to their direction of motion) of ca. 5 mm. Said thickness is tapered to zero along the eclipsing edges PE1-PE4, so as to form blade-like edges. The plates P1-P4 are, for example, driven using small linear motors.

Embodiment 2

Figure 5:
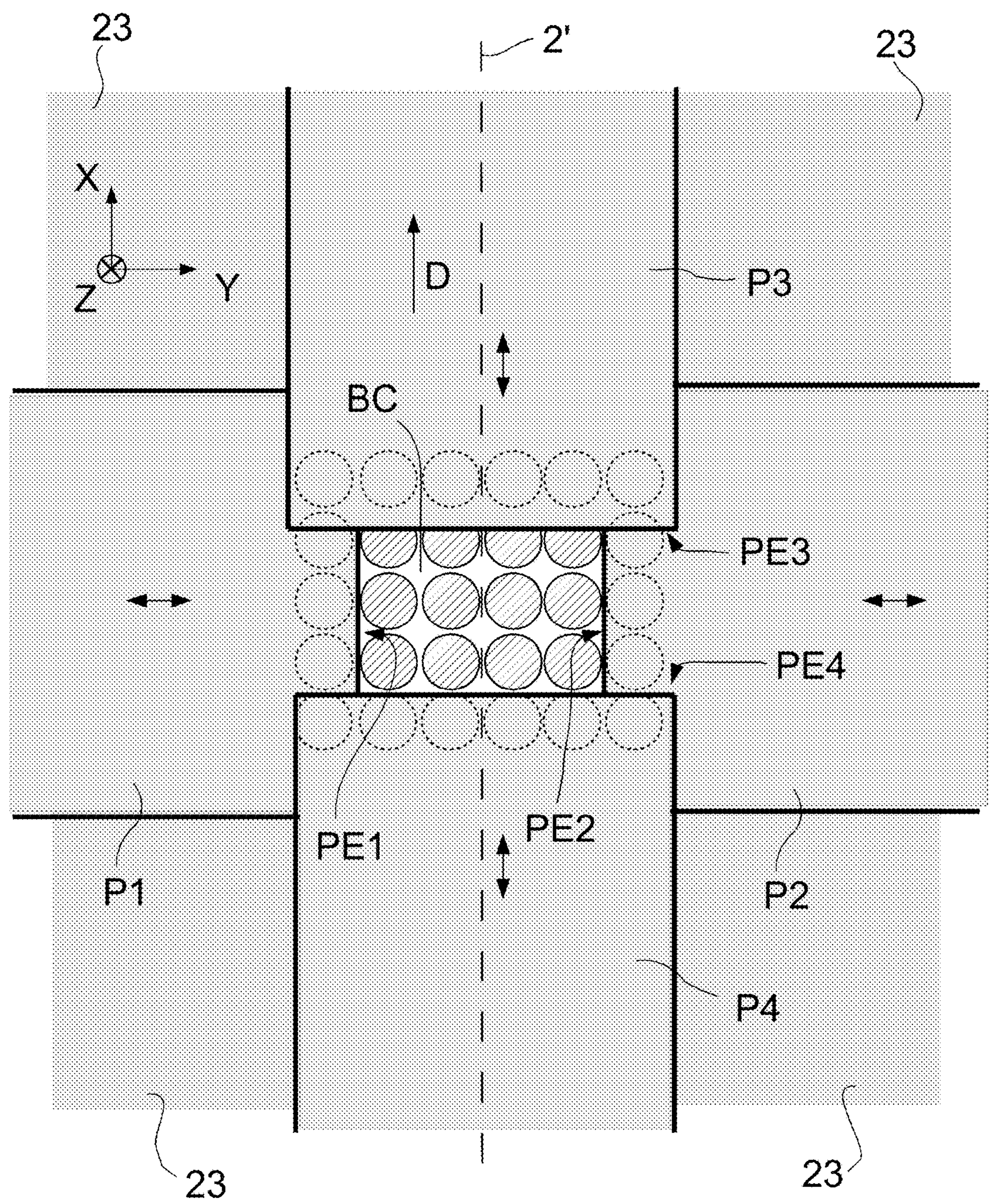
FIG. 5 corresponds largely to FIG. 4, except for the positioning of certain features within the Figure, and illustrates another embodiment of the current invention.

In FIG. 4, the plate P3 was used to create a boundary located exactly between the core BC and periphery BP, fully eclipsing the latter and leaving the former fully un-occluded. However, an alternative scenario is shown in FIG. 5, which corresponds to FIG. 4 except as regards the X position of plate P3. In FIG. 5, the eclipsing edge PE3 of plate P3 has been parked so as to partially eclipse the leading row of (four) beams in the core BC. This allows a user of the inventive apparatus to experiment with a core BC in which the leading edge has a somewhat lower intensity than the rest of the core (e.g. so as to perform thermal pre-processing) without having to put a different (custom) DOE 8 on the table 82.

Embodiment 3

Figure 6:
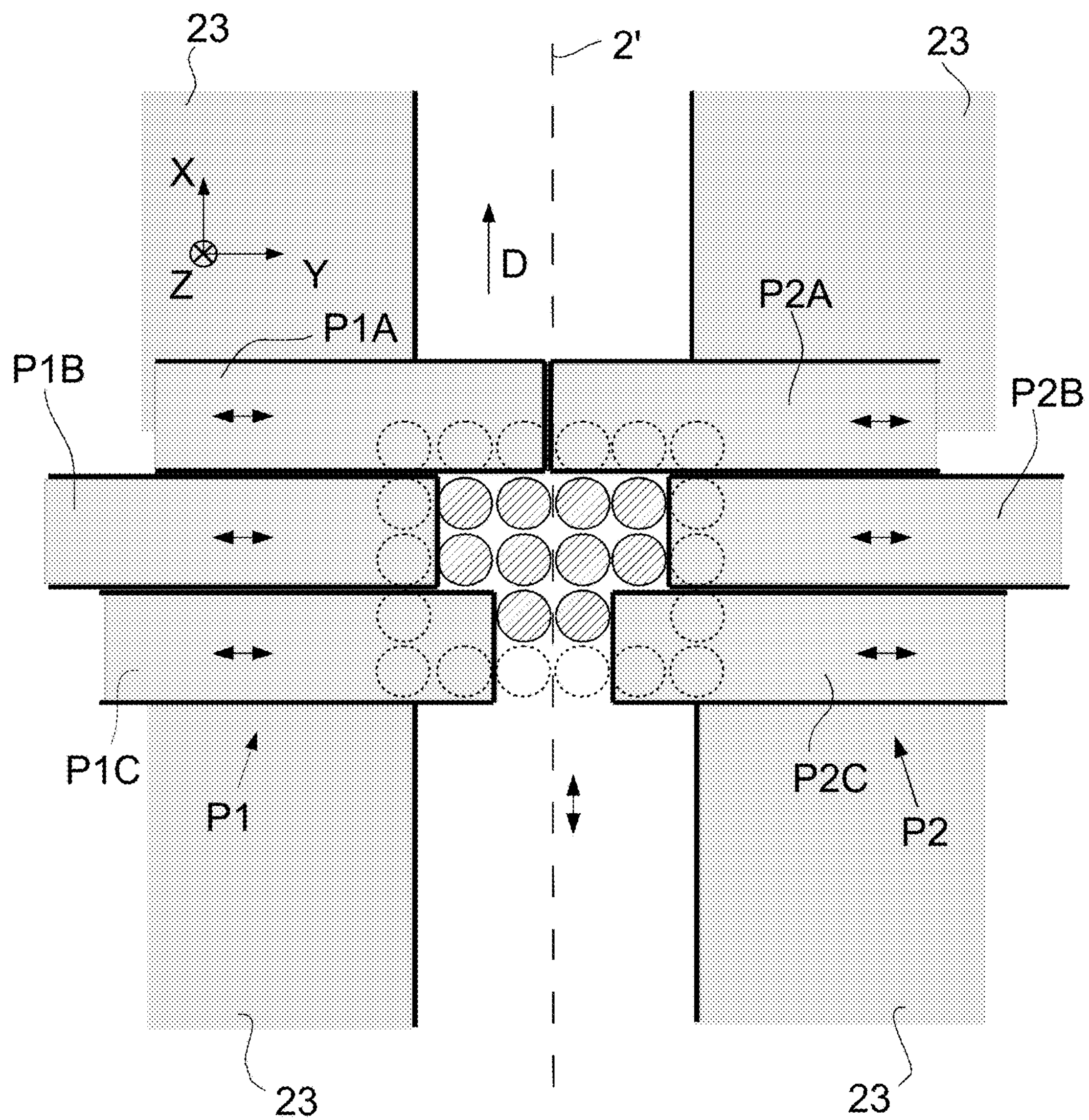
FIG. 6 corresponds largely to FIG. 4, except for the number/form of certain features within the Figure, and depicts yet another embodiment of the present invention.

FIG. 6 corresponds largely to FIG. 4, except as regards the number/embodiment of motorized plates P1, P2 according to the present invention. Here, the plates P3, P4 are absent, and each of the plates P1, P2 is, in fact, embodied as a triplet of slidable sub-plates P1A, P1B, P1C and P2A, P2B, P2C, each of which can be independently driven in the ±Y direction. As here illustrated, these sub-plates have been parked so as to eclipse most of the periphery beams, and also so as to block two of the main beams. This is just one of many possible configurations, both as regards the number of sub-plates and their relative positioning.

The invention claimed is:

1. An apparatus for radiatively scribing a substantially planar semiconductor substrate along a scribelane that extends between opposing rows of semiconductor devices on a target surface of the substrate, said scribelane having a length extending parallel to a first direction and a width extending parallel to a second direction, these first and second directions lying respectively parallel to X and Y axes on an XY plane of a Cartesian coordinate system, the apparatus comprising:

a substrate holder for holding the substrate;

an illuminator for producing an adjustable array of light beams, the array comprising a first plurality of light beams with mutually different X coordinates and a second plurality of light beams with mutually different Y coordinates;

a projection system for focusing said light beams onto said target surface of the substrate when held on the substrate holder;

an actuator system for causing relative displacement of the substrate holder with respect to said light beams parallel to the XY plane; and an adjustable spatial filter located between said illuminator and said substrate holder, and comprising a plurality of motorized plates positionable and oriented so as to block a first peripheral subset of said first plurality of light beams and a second peripheral subset of said second plurality of light beams located outside a chosen inner region of said array.

2. An apparatus according to claim 1, wherein said adjustable spatial filter comprises at least two motorized plates that are independently movable parallel to said X direction and that are disposed on opposite sides of said array.

3. An apparatus according to claim 1, wherein said adjustable spatial filter comprises at least two motorized plates that are independently movable parallel to said Y direction and that are disposed on opposite sides of said array.

4. An apparatus according to claim 1, wherein at least one of the plates comprises a plurality of parallel fingers that are individually slidable relative to one another.

5. An apparatus according to claim 1, wherein the illuminator produces said array with the aid of at least one Diffractive Optical Element.

6. An apparatus according to claim 5, wherein the illuminator comprises:

a holder for storing a plurality of different Diffractive Optical Elements;

a exchanging mechanism for positioning a chosen one of said Diffractive Optical Elements upon an optical axis of said projection system.

7. An apparatus according to claim 6, comprising a controller that can automatically adjust the position of said motorized plates in dependence upon which Diffractive Optical Element is chosen from said holder.

8. A method of radiatively scribing a substantially planar semiconductor substrate along a scribelane that extends between opposing rows of semiconductor devices on a target surface of the substrate, the method comprising:

providing the substrate on a substrate holder;

focusing onto the target surface of the substrate an adjustable array of plural light beams, such array including a first plurality of light beams with mutually different X coordinates and a second plurality of light beams with mutually different Y coordinates;

causing relative displacement of said substrate holder relative to said array, so as to translate said array along said scribelane; and blocking selected light beams of said array before they impinge on said substrate, using an adjustable spatial filter comprising a plurality of motorized plates adjustable and oriented so as to block a first peripheral subset of said first plurality of light beams and a second peripheral subset of said second plurality of light beams located outside a chosen inner region of said array.

9. An apparatus for radiatively scribing a substantially planar semiconductor substrate along a scribelane that extends between opposing rows of semiconductor devices on a target surface of the substrate, the scribelane having a length extending parallel to a first direction and a width extending parallel to a second direction, the first and second directions lying respectively parallel to X and Y axes of a Cartesian coordinate system, the apparatus comprising:

a substrate holder configured to hold the substrate;

an illuminator configured to produce an adjustable array of several light beams;

a projection system configured to focus said light beams onto the target surface of the substrate when held on the substrate holder;

an actuator system configured to cause relative displacement of the substrate holder with respect to said light beams parallel to an XY plane;

an adjustable spatial filter positioned between said illuminator and said substrate holder, and comprising a plurality of motorized plates adjustable so as to at least partially block selectable light beams of the array; and at least one motorized plate of the motorized plates comprises a plurality of parallel fingers that are individually slidable relative to one another.

* * * * *